June 2, 1959 R. F. SHEA 2,889,416

TEMPERATURE COMPENSATED-TRANSISTOR AMPLIFIER

Filed March 30, 1955

INVENTOR:
RICHARD F. SHEA,
BY George V. Eltgroth
HIS ATTORNEY 2,889,416
Patented June 2, 1959

2,889,416

TEMPERATURE COMPENSATED-TRANSISTOR AMPLIFIER

Richard F. Shea, Syracuse, N.Y., assignor to General Electric Company, a corporation of New York Application March 30, 1955, Serial No. 497,964
9 Claims. (Cl. 179—171)

This invention relates to transistor amplifier circuits and more particularly to temperature-compensated transistor amplifier circuits.

It is well known that temperature affects almost all of the parameters of transistors. The effect of temperature changes on intermediate amplifier stages and particularly on output amplifier stages becomes pronounced due to the extreme excursions of voltage and current in these stages. Compensation for temperature changes must be provided in order to prevent non-linear operation by the amplifier and severe loss of power output.

Prior art disclosures have provided compensation for temperature changes by changing the D.-C. operating point of the transistor. This method is critical because changing the operating point of the transistor changes the transistor parameters and the current amplification of the transistor.

It is an object of this invention to provide a new and improved transistor amplifier circuit which will maintain a constant power output over a wide temperature range. This is accomplished by providing a transistor amplifier with a degenerative feedback path which includes a temperature sensitive resistance. Variation in this resistance due to temperature changes varies the amount of degeneration which provides the desired compensation.

It is a further object of this invention to provide an efficient temperature-compensated transistor amplifier circuit which is simple in construction.

Still another object of this invention is to provide a temperature-compensated transistor amplifier circuit which has a wider range of control over the power output of the transistor amplifier than previously known circuits.

These and other advantages of the invention will be more clearly understood from the following description taken in connection with the accompanying drawings and its scope will be apparent from the appended claims.

Figure 1:
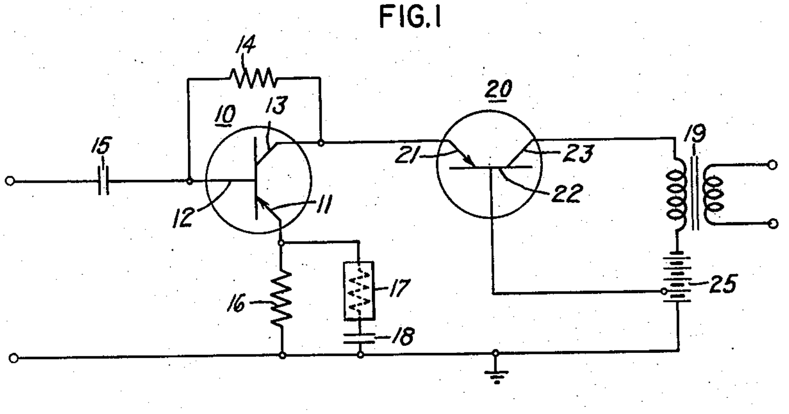
Figure 2:
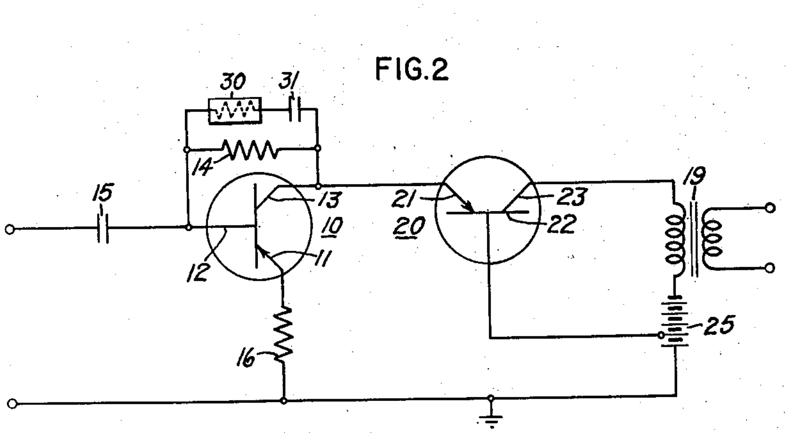

In the drawings, Figures 1 and 2 are diagrammatic illustrations of the invention.

Figure 1 shows an illustrative embodiment of the invention which includes a compensated transistor amplifier stage 10 connected to and driving a transistor power output stage 20. A previous amplifier stage or source is coupled to base electrode 12 of P–N–P junction transistor 10 by a coupling capacitance 15. A biasing resistance 14 is connected between the collector electrode 13 and base electrode 12 of transistor 10. Emitter electrode 11 of transistor 10 is connected through resistance 16 and through temperature-sensitive resistance 17 and a capacitance 18 to ground. This portion of Figure 1 comprises the temperature-compensated stage. Collector 13 of P–N–P junction transistor 10 is connected to the emitter electrode 21 of P–N–P junction transistor 20. The collector electrode 23 of junction transistor 20 is connected through the primary winding of output transformer 19 to the negative terminal of a source of potential 25. Base electrode 22 of transistor 20 is connected to a tapped portion of the source of potential 25. The positive terminal of source of potential 25 is connected to ground. Resistances 14 and 16 are utilized to set up D.-C. operating points for the transistors.

Transistors are highly temperature sensitive; particularly when used in power output stages due to large power dissipation in these stages which increases the junction temperatures. The parameters and operating points will change even when comparatively well stabilized. Consequently, the power output normally decreases with increasing temperature provided that the input signal to the power output stage is held constant. I have found that in order to compensate for decreases in power output with increasing temperature, it is necessary to vary the input signal so that the input signal increases with increasing temperatures.

This is accomplished in Figure 1 by providing a degenerative feedback path which in this case includes temperature-sensitive resistance 17 in series with blocking capacitor 18 in the emitter circuit of transistor 10. Variations in resistance 17 due to temperature changes causes variations in current amplification, which in turn varies the drive on transistor amplifier 20, thus providing the desired compensation. In the arrangement shown in Figure 1, resistance 17 must decrease with increasing temperature to provide a current amplification which increases with temperature. An additional effect of connecting temperature-responsive resistance 17 across biasing resistor 16, is that the input resistance of transistor 10 decreases with increasing temperature. It should be noted that by using blocking capacitor 18, the amount of degeneration will not affect the D.-C. operating point of transistor 10. Thus, the means utilized by this invention for providing compensation for temperature changes does not include changing the D.-C. operating point of transistor 10.

The circuit of Figure 2 differs from that in Figure 1 in that the degenerative feedback path is connected between the collector electrode 13 and the base electrode 12 of transistor 10 instead of being connected in the emitter circuit as shown in Figure 1. A temperature-responsive resistance 30 and a blocking capacitor 31 are connected across the biasing resistance 14. As in Figure 1, the effect of temperature-sensitive resistance 30 and blocking capacitance 31 is to increase the signal current supplied to transistor 20 at high temperature by changing the current gain of transistor amplifier stage 10 without changing the D.-C. operating point of transistor 10. With temperature-responsive resistance 30 connected across resistance 14, the temperature-responsive resistance 30 should increase with increasing temperature which, incidentally, results in an increasing input resistance with increasing temperature.

It can be seen that by using temperature-responsive resistors of the proper character, it is possible to obtain a current amplification which increases and an input resistance which increases, decreases or remains constant with increasing temperature. The proper utilization of these two effects provides an excellent means for compensating both intermediate and output stages for changes in temperature.

The degeneration obtained by the use of temperature sensitive resistances as shown affects the gain and the input and output resistances of the compensating amplifier stage. By proper selection of this resistance, the desired compensation may be obtained. The value of the compensating resistance may be determined by using the analysis of a grounded-emitter configuration given in "Principles of Transistor Circuits," by R. F. Shea, pages 56 and 57, published by John Wiley and Sons. With reference to Figure 1, for example, the temperature-sensitive resistance may be considered as a part of the emitter resistance of transistor 10. It will be noted that changes in emitter resistance may have an appreciable effect on current amplification, gain, and on the input impedance of transistor 10. As expected, degeneration reduces gain. Also, for optimum gain, the source impedance should match the input impedance of transistor amplifier 10. Since the value of input impedance is changing due to variations in the amount of degeneration, an additional change in gain is encountered due to mismatch between the source and input impedances. The change in gain due to mismatch and due to the change in emitter resistance alone may produce an additive effect or a partial cancellation. The selection of the proper temperature-sensitive resistance will give the desired results. For example, if the degeneration increases the input resistance with increasing temperature and the source impedance is higher than the input resistance initially, there will be greater gain at high temperatures than at low temperatures because the two are approaching a better match at higher temperature. Conversely, if the source impedance is low initially, the mismatch will be greatest at high temperatures with a resulting reduction in gain.

If a number of amplifier stages are cascade connected to a power output stage, some consideration must be given to gain variation in the previous stages since the loss in gain will produce a cumulative effect. The problem is not as severe as in power output stages because power dissipation is considerably reduced and changes in transistor parameters will depend primarily on ambient temperature changes. Degeneration may be used to compensate for changes of gain in these stages using the methods shown in either Figure 1 or Figure 2.

Thus, the invention by means of degeneration varies the gain and impedance of a transistor amplifier stage to provide a constant power output. By proper selection of a temperature-sensitive resistance using the approach set forth, the right amount of compensation may be provided to give stabilized amplifier operation over a temperature range of $-55°$ C. to $+100°$ C. depending on the physical characteristics of the transistor employed.

Compensated amplifier stage 10 has been illustrated here as driving a power output stage. It will be appreciated that this stage may be used to drive intermediate and other amplifier stages. The power output stage was selected for purposes of illustration because output stages of transistor amplifier circuits require the most compensation due to large current and voltage excursions occurring with changes in temperature.

It will also be appreciated by those skilled in the art that although P–N–P transistors have been shown, N–P–N transistors may be used with a reversal of battery polarity.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. In a temperature-compensated amplifier, a first transistor having base, emitter and collector electrodes, a first resistance connected between the base and collector electrodes of said first transistor, a second resistance, a common bus, means connecting said second resistance between said emitter electrode and said common bus, means for degeneratively coupling a portion of the output signal of said first transistor to the input of said transistor, said means including a temperature responsive resistance connected in series with a capacitance to vary the amplitude of said portion of the output signal as a function of temperature, a second transistor having base, emitter and collector electrodes, means connecting the collector electrode of said first transistor to the emitter electrode of said second transistor, a source of potential, utilization means, means coupling said utilization means and said source of potential between the collector electrode of said second transistor and said common bus, means connecting the base electrode of said second transistor with a portion of said source of potential, whereby the output signal applied to said utilization means is maintained substantially constant with changes of temperature.

2. In a temperature-compensated amplifier, a first transistor having base, emitter and collector electrodes, a first resistance connected between the base and collector electrodes of said first transistor, a second resistance, a common bus, means connecting said second resistance between said emitter electrode and said common bus, means for degeneratively coupling a portion of the output signal of said first transistor to the input of said transistor comprising a temperature sensitive resistance and a capacitance connected in series between said emitter electrode and said common bus to vary the amplitude of said portion of the output signal as a function of temperature, a second transistor having base, emitter and collector electrodes, means connecting the collector electrode of said first transistor to the emitter electrode of said second transistor, a source of potential, utilization means, means coupling said utilization means and said source of potential between the collector electrode of said second transistor and said common bus, means connecting the base electrode of said second transistor with a portion of said source of potential, whereby the output signal applied to said utilization means is maintained substantially constant with changes of temperature.

3. The device defined in claim 2 in which the resistance of said temperature-sensitive resistance decreases with increasing temperature.

4. In a temperature-compensated amplifier comprising a first transistor having base, emitter and collector electrodes, a first resistance connected between the base and collector electrodes of said first transistor, a second resistance, a common bus, means connecting said second resistance between said emitter electrode and said common bus, means for degeneratively coupling a portion of the output signal of said first transistor to the input of said transistor comprising a temperature-sensitive resistance and a capacitance connected in series between the base and collector electrodes of said first transistor to vary the amplitude of said portion of the output signal as a function of temperature, a second transistor having base, emitter and collector electrodes, means connecting the collector electrode of said first transistor to the emitter electrode of said second transistor, a source of potential, utilization means, means coupling said utilization means and said source of potential between the collector electrode of said second transistor and said common bus, means connecting the base electrode of said second transistor with a portion of said source of potential, whereby the output signal applied to said utilization means is maintained substantially constant with changes of temperature.

5. The device defined in claim 4 in which the resistance of said temperature-sensitive resistance increases with increasing temperature.

6. In a temperature-compensated circuit, a transistor having base, emitter and collector electrodes, output means connected to said collector electrode to provide an output signal, a first resistance connected between the base and collector electrodes of said transistor, a second resistance, means connecting said second resistance to said emitter electrode, a source of potential, means for applying said source of potential to said collector electrode and said output means, means connecting said source to said second resistance and means for degeneratively coupling a portion of the output of said transistor to the input of said transistor, said means comprising a series combination of a temperature-sensitive resistance and a capacitance connected in parallel with said second resistance to vary the amplitude of said portion of the output as a function of temperature and maintain the output signal from said transistor constant with changes in temperature.

7. The circuit defined in claim 6 in which the resistance of said temperature-sensitive resistance decreases with increasing temperature.

8. In a temperature-compensated circuit, a transistor having base, emitter and collector electrodes, output means connected to said collector electrode to provide an output signal, a first resistance connected between the base and collector electrodes of said transistor, a second resistance, means connecting said second resistance to said emitter electrode, a source of potential, means for applying said source of potential to said collector electrode and said output means, means connecting said source to said second resistance and means for degeneratively coupling a portion of the output of said transistor to the input of said transistor, said means comprising a series combination of a temperature-sensitive resistance and a capacitance connected in parallel with said first resistance to vary the amplitude of said portion of the output as a function of temperature and maintain the output signal from said transistor constant with changes in temperature.

9. The circuit defined in claim 8 in which the resistance of said temperature-sensitive resistance increases with increasing temperature.

References Cited in the file of this patent

UNITED STATES PATENTS

| | | |
|---|---|---|
| 2,369,030 | Edwards | Feb. 6, 1945 |
| 2,468,082 | Chatterjea et al. | Apr. 26, 1949 |
| 2,757,243 | Thomas | July 31, 1956 |
| 2,764,643 | Sulzer | Sept. 25, 1956 |
| 2,801,297 | Becking et al. | July 30, 1957 |

OTHER REFERENCES

Shea Text, "Principles of Transistor Circuits," pages 120, 166–181, 257, 258, 349, 350, published 1953 by John Wiley Sons, New York, N.Y. Copy in Class. Div. II.

Becker et al., "Properties—Resistors," Transactions, Electrical Engineering, volume 65, November 1946, pp. 711–725 (pp. 718–725 only relied on). Copy in 250–36–7.5.